United States Patent [19]

Swinehart

[11] 4,050,905
[45] Sept. 27, 1977

[54] GROWTH OF DOPED CRYSTALS

[75] Inventor: Carl F. Swinehart, University Heights, Ohio

[73] Assignee: The Harshaw Chemical Company, Cleveland, Ohio

[21] Appl. No.: 581,233

[22] Filed: May 27, 1975

[51] Int. Cl.² .................. B01D 9/00; B01J 17/08; B01J 17/36; C01D 3/00

[52] U.S. Cl. ........................ 23/301; 23/304; 23/302 R; 156/605; 156/616 R; 252/307.4 H

[58] Field of Search .............. 156/605, 606, 616; 252/301.4 R, 301.4 P, 301.4 H, 301.4 F, 301.4 S; 148/171, 172; 23/300, 301 R, 302, 304

[56] References Cited

U.S. PATENT DOCUMENTS

| 2,149,076 | 2/1939 | Stockbarger | 156/616 |
| 2,835,614 | 5/1958 | Pohl | 156/605 |
| 3,342,560 | 9/1967 | Eckardt et al. | 156/605 X |
| 3,615,262 | 10/1971 | Kappelmeyer et al. | 156/605 X |
| 3,925,108 | 8/1976 | Woodbury et al. | 156/618 |
| 3,926,566 | 12/1975 | Spurney | 156/616 |

OTHER PUBLICATIONS

Plovnick et al., "A Dopant Injector for Crystal Pulling Furnaces," Rev. Sci. Instrum. USA, vol. 41, No. 8, pp. 1248–1249, (Aug. 1970).

Primary Examiner—Norman Yudkoff
Assistant Examiner—Barry I. Hollander
Attorney, Agent, or Firm—James A. Lucas

[57] ABSTRACT

Large, doped crystal ingots are grown in a Stockbarger furnace from a melt of an alkali metal or alkaline earth metal salt using very slow oscillation (1 – 2 cycles per minute) of the ingot through a small arc of 5° –20° to produce an ingot having a more even distribution of dopant and an absence of open boundaries between macrocrystals within the ingot.

6 Claims, 3 Drawing Figures

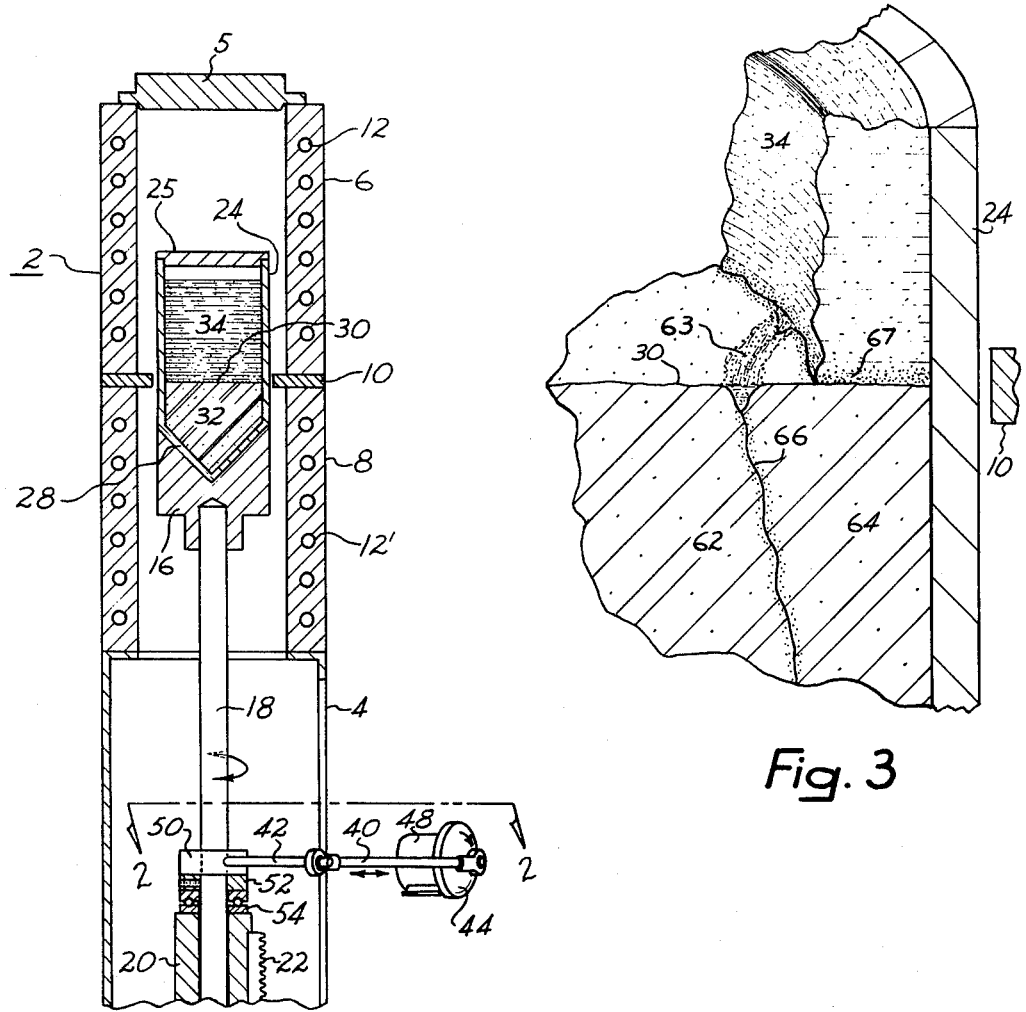
Fig. 1
Fig. 3
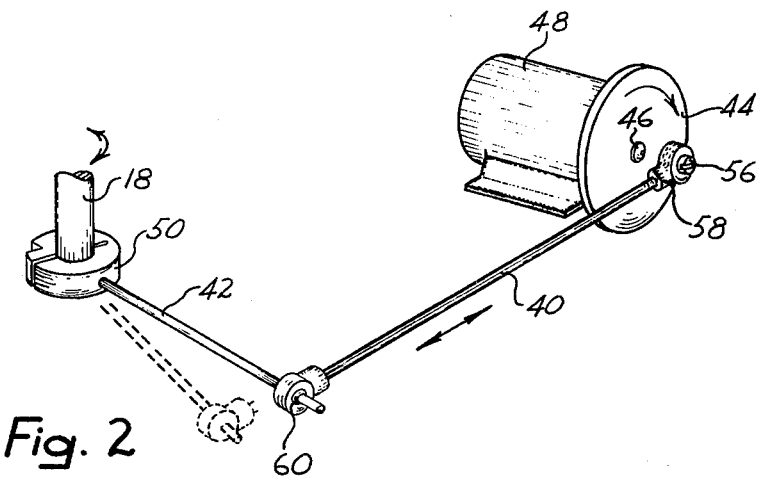
Fig. 2

GROWTH OF DOPED CRYSTALS

BACKGROUND OF THE INVENTION

1. Field of the Invention

Inorganic crystal ingots have been grown in Stockbarger furnaces on a commercial basis for many years. Pure crystals have found numerous optical uses in the medical, metal, military and other fields. Certain types of ionic crystals, particularly alkali metal and alkaline earth metal salts, when grown with a small amount of a specified impurity or dopant, have the ability to scintillate, or to give off measurable light when exposed to radiation. These scintillation crystals are used as radiation detectors for such applications as gamma ray spectrometry, geophysical surveys, and clinical detection of radioisotopes.

Crystals of these compounds are also grown with dopants to improve their hardness. This serves to avoid bending in the cleavage of X-ray diffraction plates and to enhance the yield strength of polycrystalline bodies formed therefrom.

In the growth of inorganic crystals in a Stockbarger or similar furnace, the starting material is placed in a crucible of platinum or other similar inert metal that does not react with the melt. The entire crucible is set on a vertically movable crucible holder mounted on an elevator located in the Stockbarger furnace. The furnace typically has two heating sections separated by a heat baffle. During growth, the top section of the furnace is heated to a temperature of 50° C to 150° C above the melting point of the inorganic crystal, while the bottom section of the furnace is maintained at a temperature slightly below the melting point. The crucible is initially placed in the top section, where the material is melted. Thereafter, the crucible is slowly lowered into the bottom section, whereupon the melt begins to crystallize, initially in the cone portion of the crucible. Solidification of the melt progresses upwardly through the crystal as the elevator is slowly lowered into the bottom, cooler section of the furnace.

One of the objectives of crystal growth in the Stockbarger furnace is to develop a single lattice structure. The success or failure of this objective depends upon a number of factors, including stratification of absence of thermal convection currents in the melt. Because of the much higher temperature of the liquid than the solid, there is a large flow of heat across the liquid-solid interface. Any stirring of the melt, such as that produced by convection, will disrupt the even flow of heat, change the growth rate, and cause flaws in the crystal ingot such as bubbles, or bands of high and low dopant concentration.

One problem that exists in connection with the intentional doping of inorganic salt crystals such as alkali metal halides, with scintillation dopants such as thallium, europium and sodium, is the phenomenen known as zone purification which occurs at the interface between the liquid and the solid. This phenomenen basically involves a tendency of the inorganic salt as it is crystallized to reject the impurities, which in the case of a scintillation crystal, is the dopant. As a result, the dopant becomes increasingly concentrated in the liquid at the interface. This tendency is magnified during crystal growth in a Stockbarger furnace by the fact that the large quantum of heat flowing from the liquid to the solid contributes to the ability of the inorganic salt, upon crystallization, to exclude impurities. In addition to the dopant, dissolved gases are rejected by the inorganic salt as it solidifies and tend to collect in the liquid at the crystal growth interface.

A well grown crystal ingot is composed of a single crystal lattice, or more typically, a mosaic of crystal domains so closely aligned that the behavior of the body approximates a single crystal lattice. However, when growing larger crystals of 10 inch diameter on up, it is very difficult in practice to obtain a single crystal. Instead, the ingot is composed of a plurality of macrocrystal components held tightly together. With pure materials crystallizing in the cubic system there generally are no reflections or diffraction of light at these boundaries between components, so optically single bodies are cut from these ingots which from a lattice structure viewpoint are polycrystalline. During crystal growth, any abnormality in the growth procedure is likely to generate a crack, fissure or fault which continues or propogates through the ingot as the growth proceeds, and which becomes a boundary between adjacent macrocrystals within the ingot. The dopant or any impurities that are concentrated in the liquid melt at the interface tend to collect at these boundaries between adjacent macrocrystals. This results in non-uniformity of the crystal with a relatively higher percent of dopant at the boundaries than throughout the body of each macrocrystal. The higher amount of dopant at the boundary has a tendency to lower the melting point of the crystal at these boundaries to a lower temperature isotherm, sometimes by 20° C or more. This tendency is more pronounced for dopants that form a low melting eutectic with the host crystal.

After complete solidification, the crucible containing the crystal ingot is normally removed from the growth furnace and is inverted and placed in a melt-out furnace which is heated to a temperature considerably above the melting point to separate the ingot from the crucible. This brief exposure to high temperatures, lasting no more than a few seconds, is often sufficient to melt the dopant-rich solid along the boundaries between the macrocrystals and to allow some of the dopant-rich melt to flow out of the boundaries, leaving open boundaries or cracks between the macrocrystals, and disrupting the integrity of the ingot. This seriously reduces the amount of the crystal that can be cut into usable products and limits the sizes available from a given crucible or furnace.

DISCUSSION OF PRIOR ART

Although scintillation crystals have been grown for many years, the above described problem has only recently become critical with demands for large pieces of CsI(Na), KCl(Eu) and NaCl(Eu). For this reason, there is no known prior art directed to overcoming the problems associated with grain boundary concentration during the growth of large doped crystal ingots in Bridgman or Stockbarger type furnaces. Pulling processes (Czochralski or Kyropoulos), flame fusion (Verneuil), and zone fusion all use melts that are strongly stirred by convection or rapid rotation of seed vs. crucible. For this reason, they have more limited usefulness in growing doped crystals than the Stockbarger method.

The prior art has used crucible rotation to stir the melt or to compensate for uneven heat supply, but has not used slow oscillations for the correction of boundary problems.

SUMMARY OF THE INVENTION

It is an object of the present invention to reduce the size and number of open boundaries that occur during the growth of large doped crystal ingots.

It is another object to produce doped crystal ingots having less scrap than in prior art ingots.

It is yet another object of the present invention to provide a means for the better distribution of a dopant throughout a crystal melt during ingot growth in a Stockbarger furnace.

These objects are achieved by the process of the present invention which involves the growth of an ingot of an inorganic alkali metal or alkaline earth metal salt crystal from a stratified melt of the same containing up to approximately 1.5% of a dissolved dopant, by slowly oscillating the solid crystal with respect to the melt at a rate that is adequate to maintain an even distribution of the dopant at the liquid-solid interface but that is not sufficient to disturb the temperature gradient in the melt. A typical oscillation rate of 1 to 2 cycles per minute through an arc of between 5° and 20° has been found to be satisfactory for this purpose.

BRIEF DESCRIPTION OF DRAWINGS

FIG. 1 is a cross-sectional elevation of a Stockbarger furnace during the growth of a crystal.

FIG. 2 is a perspective view of a linkage arrangement for oscillating the elevator shaft of the furnace.

FIG. 3 is an enlarged partial cross-section of the growth interface of a growing crystal within the furnace crucible without oscillation.

DETAILED DESCRIPTION OF THE INVENTION

The aforementioned problems inherent in the stratified growth of doped inorganic salts of alkali metals or alkaline earth metals are largely overcome by achieving relative movement between the solidified crystal and the melt during growth. The invention is particularly applicable to inorganic crystals that have an extremely high rejection ratio, as exemplified by cesium iodide doped with sodium, and potassium chloride doped with europium chloride. The invention is also applicable to scintillation crystals such as sodium iodide (Tl) which has a lower rejection ratio of between 3 to 1 and 5 to 1. The rejection ratio is the amount of dopant or impurity that is rejected by the crystal during growth for every unit that is accepted by the crystal. Thus, if 1 gram of a dopant is initially incorporated into a 1 kg melt and the rejection rate is 3 to 1, this means that 0.75 grams of dopant is rejected by the inorganic salt upon solidification, for every 0.25 grams that are incorporated into the solidified melt. The invention has little applicability to melts such as KCl(Rb), KCl(Br) and CaF$_2$(Eu) wherein the rejection ratio is very low, i.e. less than about 3 to 1.

It is important to keep the melt as stationary as possible during crystal growth and to maintain a stratified thermal gradient from the top of the melt down to and through the growth interface. According to the present invention, the movement of the solid crystal with respect to the melt must be sufficient to displace the crystal with respect to the melt at the interface without disrupting the Stockbarger growth. The objective is to achieve viscous laminar flow of the dopant-rich layer of liquid at the interface, thereby counter-balancing the tendency of the dopant to collect at any boundaries that are developing in the ingot during growth.

The rate, as well as the arc of oscillation, will vary to some extent in accordance with the growth parameters of the ingot, the type and concentration of dopant, and the size of the furnace. The shape of the crucible should approximate a surface of rotation about the axis of oscillation to minimize undesirable melt stirring.

A normal range of oscillation for the present invention is 1 to 2 cycles per minute with a slower oscillation rate being applied to a larger crystal such as a 20 inch diameter crystal because of the greater peripheral speed of the crucible wall, and the faster oscillation being used on smaller crystals such as 10 inch diameter crystals. The oscillation arc also varies, depending upon the speed of oscillation and the size of the crystal. An arc of 5° – 20° has been found to be suitable for use on a 10 inch crystal at a rate of 1 to 2 cycles per minute; however, this arc can be increased at slower speeds below 1 cycle per minute and decreased at speeds above 2 cycles per minute.

Referring now to the drawings, FIG. 1 shows a typical Stockbarger furnace 2 mounted upon a suitable support 4, and fitted with a lid 5. The top section 6 of the furnace contains a coil heater 12, and the bottom section 8 has a separate coil heater 12'. The two sections are separated by a baffle 10. Each heater is typically composed of a coil of Nichrome or other heating wire embedded or otherwise supported in the wall of each section. The furnace walls are made from a thermal material such as Alundum. The interior of the wall is normally lined with a refractory material (not shown) such as fire brick.

A cone holder 16 rests on an elevator shaft 18 and is held in place by the weight of a crucible 24 containing a partially grown ingot. A drive sleeve 20 includes a rack 22 which engages a pinion (not shown) to drive the shaft up and down. A cover 25 fits tightly over the crucible. During ingot growth, crystallization commences in the cone 28 of the crucible and proceeds upwardly. The interface 30 between the solidified ingot 32 and the melt 34 is in the area of the baffle 10, where the furnace temperature is approximately the same as the freezing point of the inorganic salt.

The elevator shaft 18 passes through a first clamp ring 50, a second clamp ring 52 and a thrust bearing 54 into the drive sleeve 20. A low speed motor 48 is mechanically linked to the clamp ring 50 through a pair of rods 40 and 42 and coupler 60.

The oscillating mechanism is shown in more detail in FIG. 2 which depicts a rotating disc 44 mounted on the shaft 46 of the motor 48. Rod 42 is joined to pin 56 mounted eccentrically on the rotating disc, which permits the pin 56 to rotate within the coupling 58 and to transform the rotary motion of the disc 44 into the linear motion of rod 40. A coupling 60 such as a spherical bearing rod end joins the two rods 40 and 42 together and allows the rods to continuously rotate the shaft 18 back and forth even though the vertical location of the clamp ring 50 on the shaft is constantly changing with respect to the motor 48 as the shaft is slowly lowered during crystal growth. Although the motor 48 as shown remains in one location, it is clear that it could be mounted to move vertically with the shaft.

If the disc 44 is circular, it oscillates the shaft 18 at a constant acceleration following a conventional sine wave pattern. However, other mechanical or electrical methods can be used to oscillate the shaft in a programmed or random manner, while observing the requirement that the movement must cause laminar flow of the melt across the interface while not disturbing the rest of the melt.

Instead of oscillation, a slow rotary motion can be used on smaller ingots up to 10 inches or 12 inches in diameter, so long as the motion is interrupted or the shaft is subjected to acceleration or deceleration several times during each revolution to insure proper distribution of dopant at the interface. Normally, a pause or a change in the speed of rotation should occur at least every 20° during rotation. A rotational speed of about 5° - 20° of arc per minute should be adequate to mix the melt at the interface while avoiding unnecessary stirring of the remainder of the melt.

FIG. 3 represents a partial cross-sectional view of the crystal growth interface 30 with the solidified crystal 32 represented in the form of two macrocrystals 62 and 64 having a common crystal boundary 66. For purposes of illustration, the dopant or impurity, which is dissolved in the melt, is shown in the form of particles. The particle density then is represented by the concentration of dots. It is noted that there is a heavy concentration 67 of dopant in the melt 34 immediately adjacent the interface 30 and likewise there is a high concentration of dopant at the boundary 66 separating crystals 62 and 64. The boundary 66 terminates in a groove or trough 63 at the solid interface, and this groove is filled with dopant-rich melt. Without any means for creating flow of melt along the interface, the groove continues to collect the dopant-rich melt which eventually solidifies.

By use of the present invention, the build-up of dopant at the boundary is minimized, without sacrificing the necessity of having a high concentration of dopant in the liquid layer immediately adjacent the interface. This high concentration is needed to off-set the tendency of the solidifying melt to reject the dopant.

If the oscillation of the crystal ingot is too great, resulting in the formation of eddy currents or turbulence at the surface of the interface, this will cause dilution of the melt at the interface, thereby substantially reducing the amount of dopant that is available at the interface for incorporation into the crystal. It has been found, however, that by maintaining a slow rate of oscillation through a relatively small arc a desirably laminar flow of melt over the interface will prevent unnecessary mixing, yet will encourage uniform distribution of dopant at the growth interface and prevent the accumulation of dopant at the boundaries.

The process of the present invention can be carried out in the growth of crystals that are doped, either intentionally or not, where the salt has a strong tendency to reject the dopant or impurity during crystallization.

The initial charge to the furnace is prepared by introducing a highly purified salt of an alkali metal or an alkaline earth metal into the platinum crucible. This is preferably done in a dry room, since most of the salts are hydroscopic and moisture is regarded as an undesirable contaminant in crystal growth. The dopant is introduced into the salt charge in the crucible in such a manner that it will dissolve in the melt. A lid is then placed upon the crucible and the crucible is placed on a cone holder which is set upon the shaft at the top of the furnace. The upper section of the furnace is slowly heated to a temperature of 50° to 150° above the melting point of the inorganic salt and vacuum is applied to remove moisture that is released during heating. For salts that react with air, a neutral atmosphere of nitrogen or argon or a reducing gas such as hydrogen is then introduced into the furnace and is maintained in the furnace during crystal growth to limit evaporation. When the salt is completely melted, the crucible is slowly lowered past the baffle zone from the upper section into the lower section whereupon solidification occurs. The rate of descent is generally between 1 millimeter and 3 millimeters per hour.

To exemplify the improvement shown by the teachings of the present invention, a 10 inches diameter, 8 inches high ingot of potassium chloride doped with europium was grown in a Stockbarger furnace by conventional methods without oscillation of the ingot. During the subsequent melt-out operation which is used to separate the ingot from the crucible, several open boundaries, 1 millimeter wide and 3 to 5 centimeters deep, appeared. Some of the material that flowed out from the boundaries was collected, and the melting point was found to be 21° to 26° C below the melting point of pure KCl. The dopant concentration at the boundaries was 4.8 mole percent of europium chloride $EuCl_2$ which was 80 times the dopant level in the melt and 250 times the concentration of dopant in the crystal a few millimeters away from the boundary.

A second 10 inches crystal of KCl doped with europium was grown in substantially the same manner. However, during crystal growth, the shaft was oscillated through an arc of 10° at a rate of 2 cycles per minute. The resultant crystal, after melt-out and annealing, showed no open boundaries, even though several tight closed boundaries were noted.

Large (14 inches and 17 inches diameter) ingots of sodium activated cesium iodide have shown open boundaries similar to those described above for KCl(Eu). In the past these were erroneously attributed to a mechanical distortion on the premise that boundaries would be weaker, displacements by as much as ⅛ inches having been noted after cooling to room temperature. Hot cesium iodide is plastic and will distort from its own weight on an uneven support or while held in a clamping device during transfer of the ingot, while KCl(Eu) is rigid, so the true cause for the openings was obscured.

Although the advantages of the present invention are more readily apparent in larger crystals, they can likewise be achieved, but to a lesser degree, in multiple ingots as small as 2 inches or 3 inches in diameter. In fact, 3¼ inches ingots of CsI(Na) containing at least two components with a boundary have been successfully grown using oscillation. There are a variety of other doped crystals that could benefit from the process of the present invention including NaCl doped with $EuCl_2$ and KCl doped with $SrCl_2$ for use in laser windows, NaCl doped with $SrCl_2$ and LiF doped with $MgF_2$ for X-ray plate use, LiF doped with $UO_2F_2$ for U. V. light conversion and $CaF_2$ doped with $MgF_2$. Also, limited success can be achieved in minimizing the occlusion of bubbles of dissolved gases in the solid crystal by this process.

Although the present invention has been described primarily in connection with Stockbarger growth, the principle is not limited to this type of furnace or growth.

Moving the melting point isotherm in a furnace by moving the control couple or driving the controller set point can approximate the elevator action, but it cannot provide the high gradient that can be built into the diaphragm position of a Stockbarger furnace. The slow oscillation principle described here could be applied to a moving gradient furnace and to other directional solidification processes where the solidification proceeds upward at a slow rate.

I claim:

1. In the Stockbarger method of growing inorganic alkali metal or alkaline earth metal salt crystal ingots of at least two inches in diameter and containing a plurality of crystal domains or macrocrystal components, from a stratified melt of the same containing up to 1.5% of a dissolved dopant, the improvement comprising slowly moving, with variable velocity, the solidified crystal with respect to the melt about a vertical axis at a rate that is adequate to maintain an even distribution of the dopant in the melt at the interface, but that is not sufficient to disturb the temperature gradient in the melt.

2. The method of claim 1 wherein the relative movement is achieved by oscillation.

3. The method of claim 2 wherein the solidified crystal is oscillated at a frequency of between 1 and 2 cycles per minute through an arc of between about 5° and about 20°.

4. The method of claim 1 wherein the crystal has a rejection ratio with respect to the dopant of at least 3 to 1.

5. The method of claim 4 wherein the crystal is moved at a rate that is adequate to achieve laminar flow of the melt at the solid-liquid interface.

6. The method of claim 1 wherein the solidified crystal is rotated at a rate of between about 5° and 20° of arc per minute, said rotation being subject to a change of velocity at least once every 20° of rotation.

* * * * *